(12) United States Patent
Drost

(10) Patent No.: US 6,768,195 B2
(45) Date of Patent: Jul. 27, 2004

(54) MULTI-CHIP SEMICONDUCTOR DEVICE

(75) Inventor: Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/254,178

(22) Filed: Sep. 25, 2002

(65) Prior Publication Data

US 2003/0042602 A1 Mar. 6, 2003

Related U.S. Application Data

(62) Division of application No. 09/942,356, filed on Aug. 29, 2001, now Pat. No. 6,495,396.

(51) Int. Cl.[7] .......................... H01L 23/34; H01L 23/02; H01L 23/48
(52) U.S. Cl. .................. 257/723; 257/686; 257/777
(58) Field of Search ............................... 257/678, 684, 257/686, 723, 734, 739, 777, 797, 798; 174/52.1, 255

(56) References Cited

U.S. PATENT DOCUMENTS

| | | | | |
|---|---|---|---|---|
| 5,814,885 A | * | 9/1998 | Pogge et al. | 257/730 |
| 5,998,875 A | * | 12/1999 | Bodo et al. | 257/778 |
| 6,042,391 A | * | 3/2000 | Bodo et al. | 439/74 |
| 6,188,138 B1 | * | 2/2001 | Bodo et al. | 257/778 |

OTHER PUBLICATIONS

Universal BGA/DCA Consortium, *BGA Board Level Assembly and Rework Recommendations*, QuickLogic, Apr. 19, 2000. pp. 1–5.

N.D. Morozova, et al., *Controlled Solder Self-alignment Sequence for an Optoelectronic Module without Mechanical Stops*, 47th Electronic Components and Technology Conference, May 1997, pp. 1188–1193.

* cited by examiner

Primary Examiner—Evan Pert
Assistant Examiner—Scott B. Geyer
(74) Attorney, Agent, or Firm—Zagorin, O'Brien & Graham LLP

(57) ABSTRACT

The present invention relates to semiconductor devices, including multi-chip semiconductor devices, and methods of coupling semiconductor devices. In a particular embodiment, the semiconductor device is a multi-chip semiconductor that comprises a first semiconductor device and a second semiconductor device. The first semiconductor device has a first surface. The first surface contains a first ridge alignment member and a second ridge alignment member, the first and second ridge alignment members forming a receiving area between the first and second ridge alignment members. The second semiconductor device has a second surface, the second surface containing a third ridge alignment member, the second semiconductor device positioned such that at least a portion of the third ridge alignment member is located within the receiving area of the first semiconductor device.

18 Claims, 7 Drawing Sheets

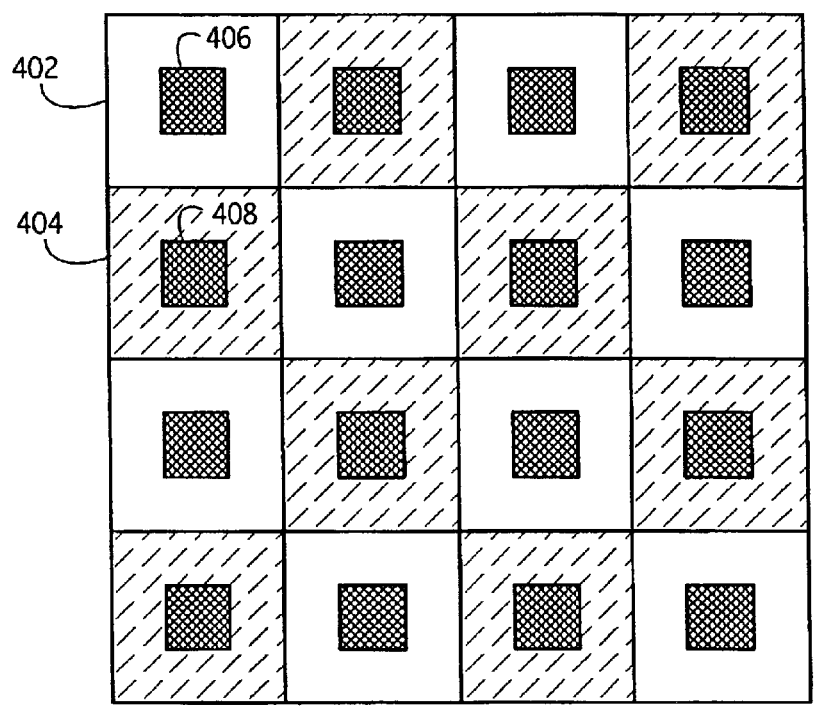
FIG. 4
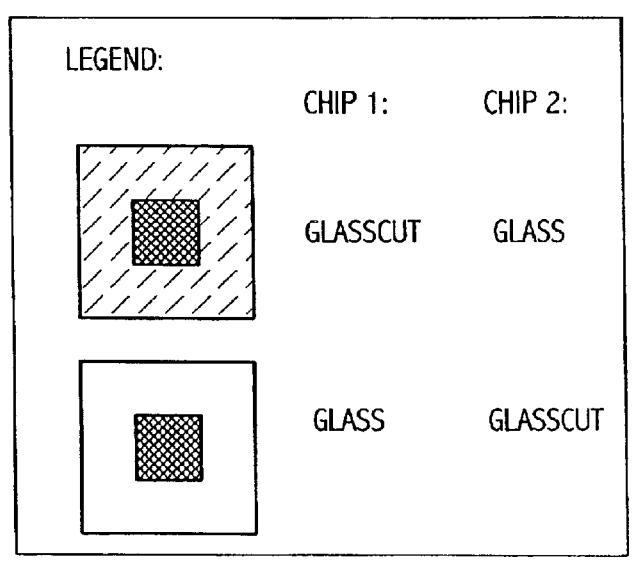

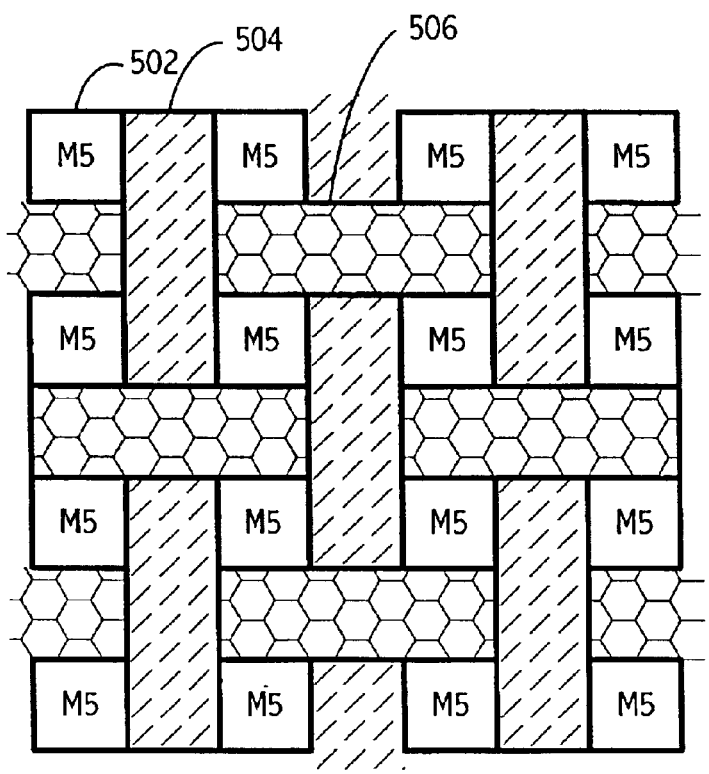
FIG. 5
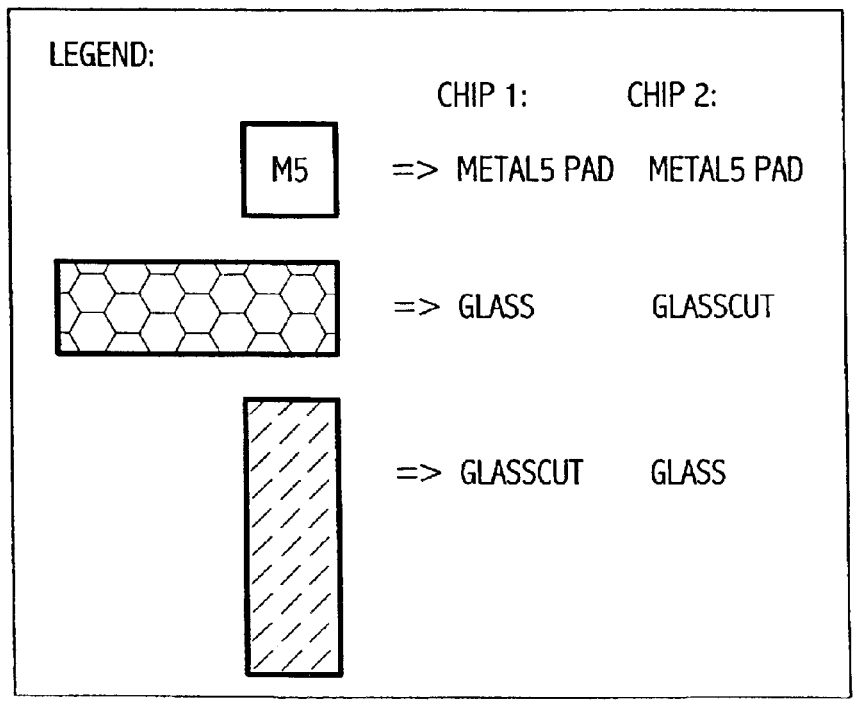

MULTI-CHIP SEMICONDUCTOR DEVICE

CROSS REFERENCE TO RELATED APPLICATIONS

This application is a divisional of U.S. application Ser. No. 09/942,356, entitled "METHOD OF COUPLING SEMICONDUCTOR DEVICES INCLUDING MULTI-CHIP SEMICONDUCTOR DEVICES" filed Aug. 29, 2001, now U.S. Pat. No. 6,495,396 the entirety of which is incorporated herein by reference.

BACKGROUND

1. Field of the Invention

The present invention relates to semiconductor devices, including multi-chip semiconductor devices, and a method of coupling semiconductor devices.

2. Description of the Related Art

For integrated circuits (IC), there is a need for additional input, output, and power connections. More specifically, where two semiconductor devices are positioned face to face with the I/O pads on the two devices aligned in the x and y directions and as near as possible in the z direction, a technical problem arises when aligning the two devices constructed using typical IC planar fabrication techniques so that critical features (the I/O signal and power pads) of the two chips are in proximity to each other. It is desirable for the alignment to be reliable, inexpensive, and accurate. In addition, the alignment should be maintainable during long-term operation. Improved accuracy in the pad alignment and reduced pad separation in the z direction would allow for a reduction in the size and pitch of pads and an increase in the total number of chip pads. Accordingly, there is a need for an improved multi-chip semiconductor device and method of coupling semiconductors.

SUMMARY

The present invention relates to semiconductor devices, including multi-chip semiconductor devices, and methods of coupling semiconductor devices. In a particular embodiment, the semiconductor device is a multi-chip semiconductor that comprises a first semiconductor device and a second semiconductor device. The first semiconductor device has a first surface. The first surface contains a first ridge alignment member and a second ridge alignment member, the first and second ridge alignment members forming a receiving area between the first and second ridge alignment members. The second semiconductor device has a second surface, the second surface containing a third ridge alignment member, the second semiconductor device positioned such that at least a portion of the third ridge alignment member is located within the receiving area of the first semiconductor device.

In another embodiment, the multi-chip semiconductor device comprises a first semiconductor device, a second semiconductor device, and a third semiconductor device. The first semiconductor device has a first surface, the first surface containing a first plurality of pads, the first surface forming a first alignment pattern. The second semiconductor device has a second surface, the second surface containing a second plurality of pads and forming a second alignment pattern. The third semiconductor device has a third surface forming a third alignment pattern. The third alignment pattern complements the first and second alignment patterns of the first and second semiconductor devices.

In another embodiment, a method of coupling a first semiconductor device and a second semiconductor device is described. The method comprises providing the first and the second semiconductor device, the first semiconductor device including a first patterned surface, the first patterned surface supporting a first plurality of circuit pads, the second semiconductor device including a second patterned surface, the second patterned surface supporting a second plurality of circuit pads; aligning the second semiconductor device with respect to the first semiconductor device such that the first patterned surface opposes the second patterned surface, wherein the first patterned surface is substantially parallel to the second patterned surface and the first patterned surface is oriented such that the first plurality of circuit pads are proximate to corresponding pads of the second plurality of circuit pads; and positioning the second semiconductor device and the first semiconductor device closer together such that the first plurality of circuit pads are capacitively coupled to the second plurality of circuit pads.

In another embodiment, the multi-chip semiconductor device comprises a first semiconductor device having a first surface, the first surface containing a first alignment region on a portion of the first surface, the first alignment region including a first ridge alignment member and a second ridge alignment member, the first and second ridge alignment members forming a receiving area between the first and second ridge alignment members; and a second semiconductor device having a second surface, the second surface containing a second alignment region on a portion of the second surface, the second alignment region including a third ridge alignment member, the second semiconductor device positioned such that the second alignment region opposes the first alignment region and such that at least a portion of the third ridge alignment member is located within the receiving area of the first semiconductor device.

In another embodiment, the semiconductor device comprises an integrated circuit device having a first surface supporting a plurality of pad elements and a plurality of circuit elements, the first surface containing a first ridge alignment member and a second ridge alignment member, the first and second ridge alignment members forming a receiving area between the first and second ridge alignment members, the receiving area formed to receive a third alignment member of a second integrated circuit device when the second integrated circuit device opposes and is substantially aligned with the integrated circuit device.

BRIEF DESCRIPTION OF THE DRAWINGS

FIG. 4 is a general illustration of a checkerboard pattern used as an alignment pattern of a semiconductor device.

FIG. 5 is a general illustration of a herringbone pattern that may be used as a surface alignment pattern.

The use of the same reference symbols in different drawings indicates similar or identical items.

DESCRIPTION OF THE DRAWINGS(S)

In a face-to-face chip communication method two semiconductor devices are designed with I/O circuits that have their pads arranged as a mirror image of each other. To connect the two devices, the devices are brought close together so that their I/O pads are aligned in the x and y direction, tangentially to the chip's surface, and as near as possible to each other in the z direction, normal to the chip's surface (to maximize capacitive coupling). The capacitive coupling between pads is utilized by I/O circuits to communicate information between the devices. Surface height variations in the surface of the devices can be designed and utilized to aid in easing and enhancing the alignment process.

In a typical planar integrated circuit fabrication technology the top layer metal and glass layers are not planarized. This is because the motivation for planarization is to allow further higher layers to have a flat surface to be built upon, the top layer metal and glass have no further layers above them. Therefore, based on the layout design of the top layer metal and glasscut patterns, there will be a surface topography that can be controlled and specifically designed using the layout of the top layer metal and glasscut layout. Typically with conventional methods, this top layer is ignored because there is no utility to the surface irregularity.

Figure 1:
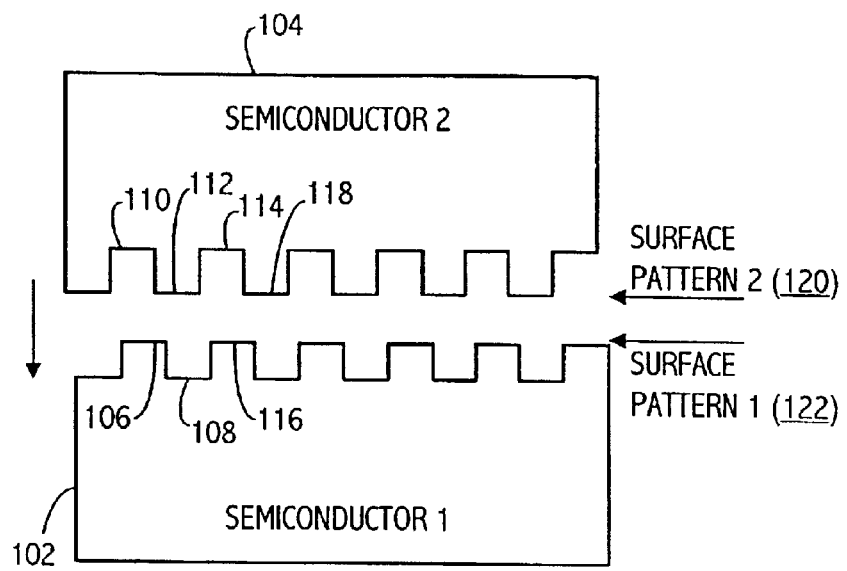
FIG. 1 is a general diagram that illustrates a multi-chip semiconductor device.

Referring to FIG. 1, a multi-chip semiconductor device is illustrated. The multi-chip semiconductor device includes a first semiconductor device 102 and a second semiconductor device 104. The first semiconductor device 102 has a surface pattern 122. The second semiconductor device 104 has a second surface pattern 120. The surface patterns 122, 120 include surface height variations formed into surface alignment patterns. The first surface alignment pattern includes a plurality of alignment ridges, such as first alignment ridge 106, and second alignment ridge 116. Between the alignment ridges in the first surface pattern 122, there are a plurality of alignment depressions, also referred to as alignment valleys. For example, between first alignment ridge 106 and second alignment ridge 116 an alignment valley 108 is formed. Similarly, for the second semiconductor device 104, the second surface pattern 120 includes a second plurality of alignment ridges. For example, as shown in FIG. 1, the second surface pattern 120 includes third alignment ridge 112 and fourth alignment ridge 118. Also shown, the second semiconductor device includes a plurality of alignment valleys, such as alignment valleys 110 and 114.

The surfaces of the first and second semiconductor devices 102 and 104 have a corresponding pattern such that each of the alignment ridges of the first semiconductor 102 are sized to fit within the plurality of alignment ridges of the second semiconductor device 104. Similarly, each of the plurality of the alignment ridges for the second semiconductor device 104 are sized to fit within the plurality of valleys of the first semiconductor device 102. When the first and second semiconductor devices 102, 104 are moved toward each other and mated, each of the alignment ridges is disposed within the corresponding and matching alignment valley of the other device. In this manner, the first and second semiconductor devices 102 and 104 may be conveniently and cost effectively aligned and connected. When the first and second semiconductor devices 102, 104 are mated, corresponding input/output paths from each of the different semiconductor devices 102, 104 are capacitively coupled. By using the pattern surfaces for alignment, the process of coupling the first and second semiconductor devices 102, 104 and accurately coupling the I/O pads of the semiconductor devices is increased. With increased accuracy of alignment and easier manufacturing, smaller I/O pads may be used and the manufacturing process may be performed at a lower cost.

Figure 2:
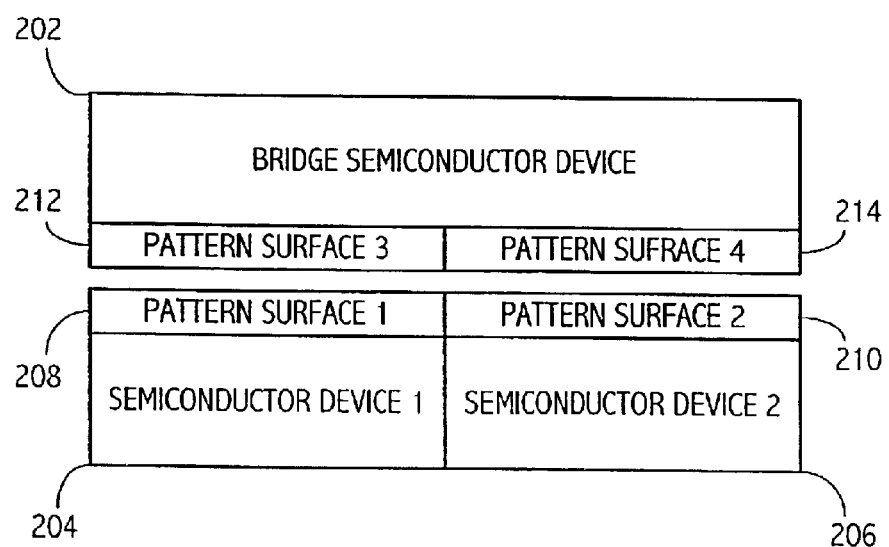
FIG. 2 is a general diagram that illustrates another embodiment of a multi-chip semiconductor device.

Referring to FIG. 2, another embodiment of a multi-chip semiconductor device is shown. The multi-chip semiconductor device includes a first semiconductor device 204, a second semiconductor device 206, and a bridge semiconductor device 202. The first semiconductor device 204 has a first pattern surface 208. The second semiconductor device 206 has a second pattern surface 210. The bridge device 202 has a third pattern surface 212 and a fourth pattern surface 214 in different regions of the bridge semiconductor device 202. The pattern surfaces of the first and second semiconductor devices 204 and 206 are formed to correspond and interlock with the corresponding pattern surfaces 212 and 214 of the bridge semiconductor device 202. The bridge semiconductor device 202 includes a plurality of input/output pads and interconnection circuits. The bridge semiconductor device 202, when mated with the first and second semiconductor devices 204 and 206, performs the function of interconnecting input/output pads of the first semiconductor device 204 and coupling those I/O pads and corresponding circuit elements to the second semiconductor device 206. Accordingly, when the bridge semiconductor device 202 is mated with the first and second semiconductor devices 204 and 206, the first semiconductor device 204 is electrically and capacitively coupled to the second semiconductor device 206. In this manner, the first and second semiconductor devices 204 and 206 may be coupled while positioned in an adjacent side-by-side manner, instead of the face-to-face embodiment shown in FIG. 1.

In one permutation, the bridge device 202 that contains only pads and interconnect wires and can be constructed to join two chips that are edge-butted with their pads on the same side of the chips. The bridge device 202 could be fabricated in a simple older integrated chip process to reduce cost and also could be cheaper than fabrication of a large multi-chip module (MCM) substrate. The bridge device 202 may be aligned and joined to both chips. The group of the two devices 204, 206 and the joined bridge device 202 may be assembled using typical industry techniques (e.g., wirebonding, flip-chip assembly) as if it were one larger chip.

Figure 3:
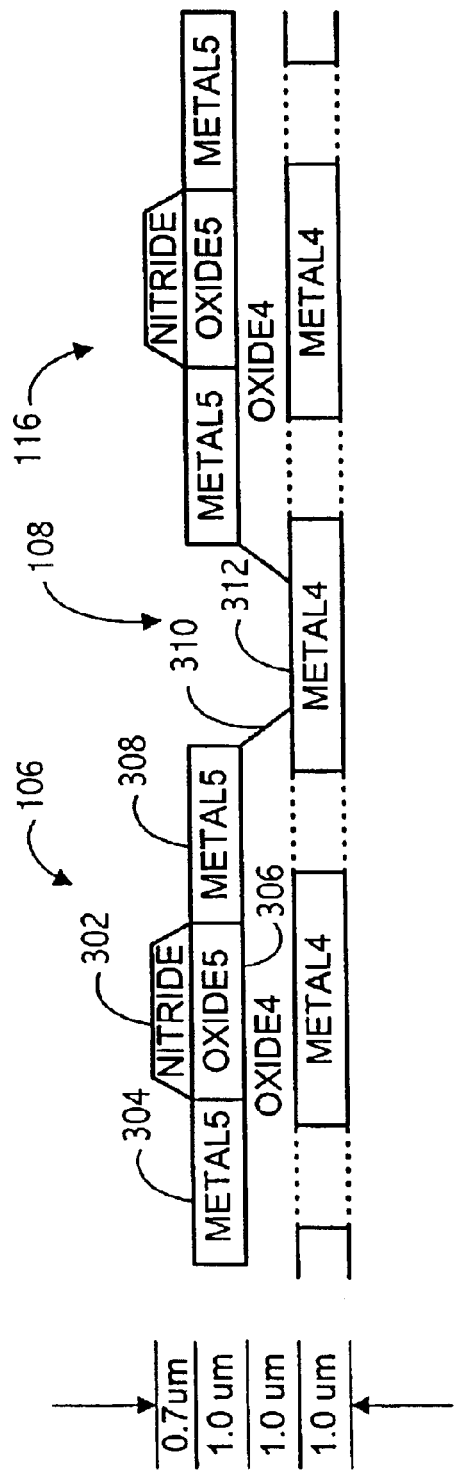
FIG. 3 is a general diagram that illustrates a cross-section of top layers of a patterned surface of a semiconductor device.

Referring to FIG. 3, an illustration of a side view of the variable height surface of the first semiconductor device 102 is illustrated. As shown in FIG. 3, the surface includes a plurality of layers of different metal and oxide regions. The surface includes a first alignment ridge 106 that includes oxide layer 310 and 306 and includes metal layers in regions 304 and 308. In addition, the first alignment ridge 106 includes nitride layer 302. Between the first alignment ridge 106 and the second alignment ridge 116 is the alignment valley 108. The alignment valley 108 is formed by a glasscut between layer 5 areas on the semiconductor surface. Within the alignment valley 108 an input/output pad may be formed by the layer 4 metal area 312.

FIG. 3 illustrates the top layers of a typical integrated chip five-layer metal process with five layers of metal interconnect. For a typical process, thicknesses of the layers are as follows: Metal4 and Oxide4 (between Metal4 and Metal5) are planarized so that the surface beneath Metal5 is flat, the height of Oxide4 above Metal4 is 1.0 um, Metal5 is 1 um thick, Oxide5 is 1 um thick (whether it is above Metal5 or not), Nitride is 0.7 um thick (whether it is above Metal5 or not), Oxide5 and Nitride are the top two layers of passivation for the chip, and wherever there is a "glasscut" both Oxide5 and Nitride are deleted as well as Oxide4 (this is typically done so that laser cuttable "fuses" can be created in Metal4).

Referring to FIG. 4, a checkerboard pattern for the surface pattern 122 is illustrated. As shown, the surface pattern includes glasscut regions and glass regions. Both the glass regions, such as glass region 402, and glasscut regions, such as region 404, have a metal pad within the region, such as metal pads 406 and 408. The metal pad is used as an input/output pad.

Different patterns can be used to provide local alignment between the two chips of the multi-chip semiconductor device. One such pattern, shown in FIG. 4, is a checkerboard pattern (covering at most, one of any pair of Metal5 pads aligned between two chip surfaces). A particular pattern may reduce the separation distance (in z direction) between two aligned Metal5 pads by a factor of two (because one Oxide5 and Nitride are removed), such as from 2*1.7 um to 1.7 um (1.7 um is the sum of the Oxide5 and Nitride thickness).

Referring to FIG. 5, another embodiment of an alignment surface pattern for multi-chip semiconductor devices is shown. In this embodiment, the alignment pattern is a herringbone pattern. The herringbone pattern includes metal regions such as metal region 502, glasscut regions such as region 504, and glass regions such as region 506.

With the herringbone pattern, the vertical stripes represent glasscuts on one device, and the horizontal stripes represent glasscuts on the other corresponding device. Additionally, both chips have glasscuts over their Metal5 pads. An illustrative herringbone pattern is shown in a two-dimensional top view in FIG. 5, and is shown with three-dimension views in FIGS. 6 to 9. In this pattern, between the Metal5 pads on a given chip, there are either 0.7 um Nitride ridges, or 1.7 um deleted Oxide5 and Oxide4 valleys. When the two chips are brought into alignment, the ridges fit into the valleys (because 0.7 um<1.7 um) and the pairs of aligned Metal5 pads will contact and will be capacitively coupled to each other.

Because the bare Metal5 pads will typically have built up a thin oxide layer by exposure to oxygen in the atmosphere, the pads will not necessarily have a low impedance connection. But, they will have a very high capacitive coupling because the distance between the pads will be very small. If a low impedance connection is also desired, different methods may be employed. For instance, the thin oxide layer covering Metal5 may be removed before alignment and the alignment could be performed in a vacuum. Alternatively, a high voltage could be driven between the two pads after alignment, causing the oxide region to break down and the two pads to fuse together.

In addition to the local alignment pattern, a global alignment is used because the local patterns are repetitive in x and y and could allow erroneous alignment if an x or y error distance equaled a multiple of the x or y local alignment pattern's repeat. A global alignment may be formed by a geographic feature, such as two rectangles, circles, or polygons, that fit within each other. The global patterns may encompass the entire array of pads on each chip, or may be placed at two or more corners of the surface-to-surface aligned area (or both).

Figure 6:
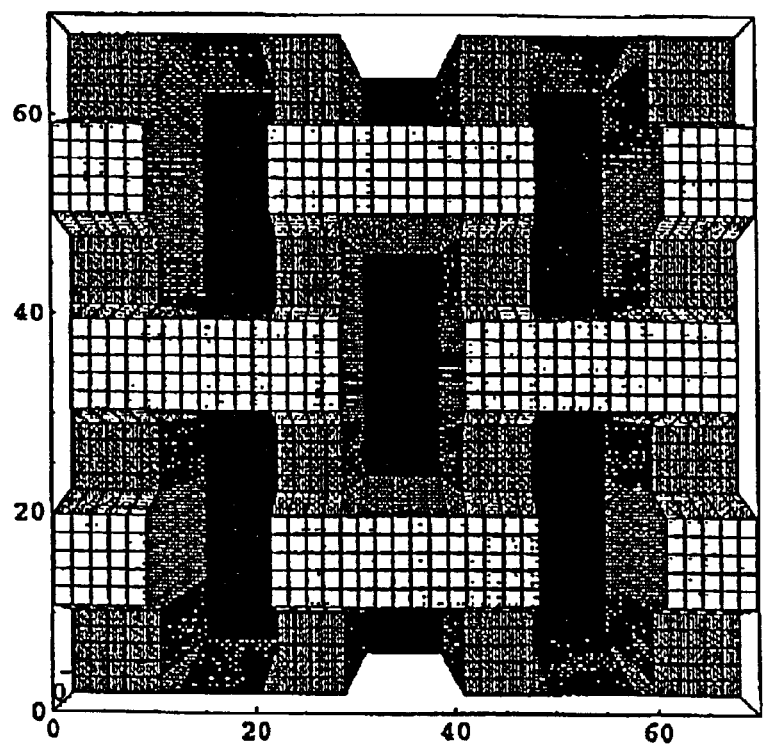
FIGS. 6–9 show perspective views that illustrate the herringbone pattern.
Figure 7:
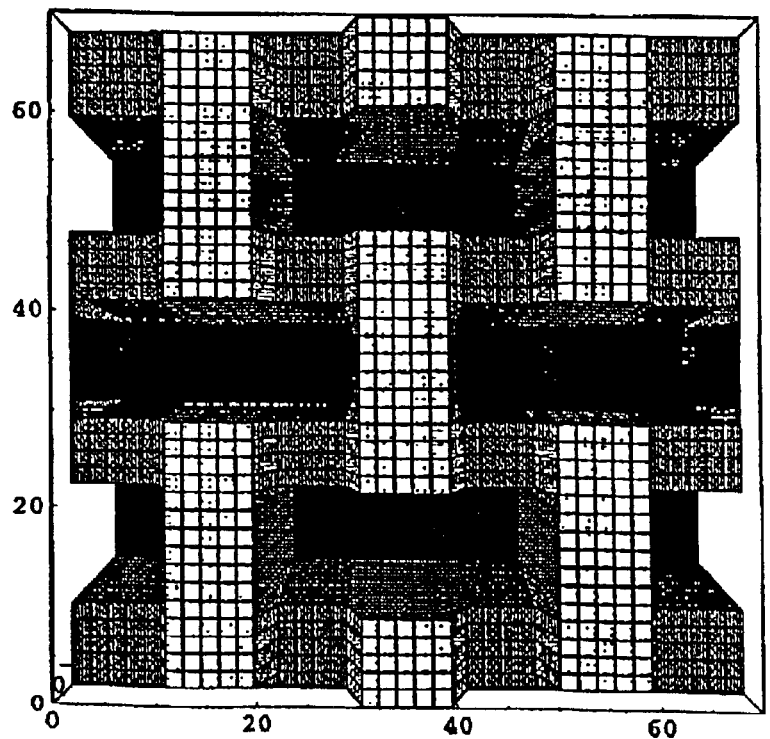

FIGS. 6 and 7 illustrate a 3-D view of a first herringbone surface pattern for a first semiconductor device and a second herringbone surface pattern for a second semiconductor device. As shown, the first and second patterns are complimentary and substantially mirror images, such that when the first and second semiconductor devices are in a face-to-face relationship, the patterns interlock and provide alignment.

Figure 8:
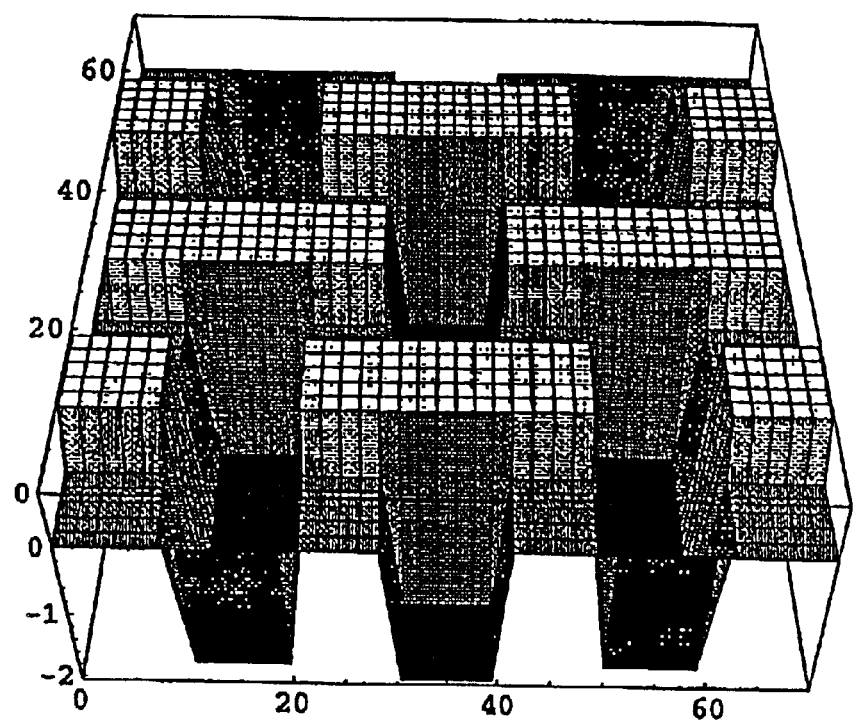
Figure 9:
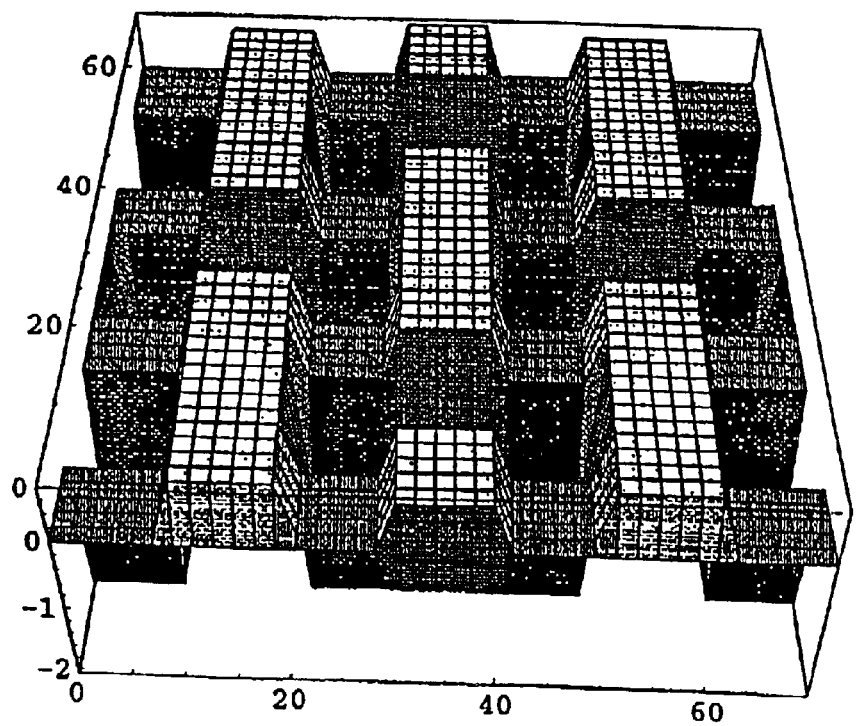

FIG. 8 and FIG. 9 illustrate via an angle view with 3-D topography of the first and second surface patterns using the herringbone method.

Figure 10:
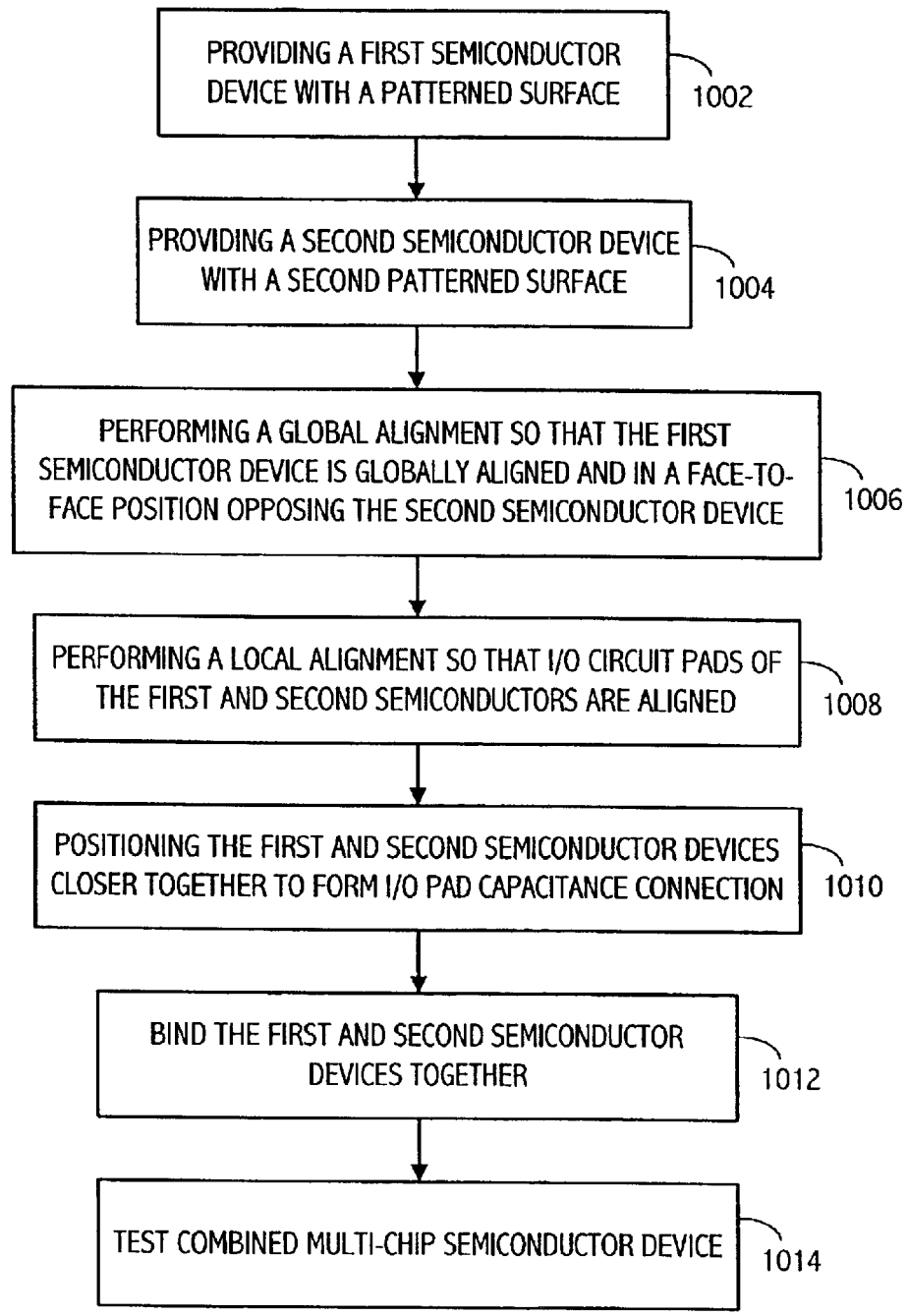
FIG. 10 is a flow chart that illustrates a method of coupling semiconductor devices.

Referring to FIG. 10, a method of aligning semiconductor devices to form a multi-chip device is shown. The method includes a first step of providing a first semiconductor device with a patterned surface, at 1002. Next, the method provides a second semiconductor device with a second patterned surface, at 1004. A global alignment is then performed such that the first semiconductor device is globally aligned and in a face-to-face position opposing the second semiconductor device, at 1006. A local alignment is then performed so that the input/output circuit pads of the first and second semiconductors are aligned at a local alignment level, at 1008. The first and second semiconductor devices are then positioned closer together and mated to form input/output circuit pad capacitance connections. Once the devices have been mated, at 1010, the first and second semiconductor devices are then bound together, at 1012. By attaching and binding the devices together, the multi-chip semiconductor device is stabilized. At 1014, the combined multi-chip semiconductor device is tested. The test is performed to validate proper connections between the various circuit elements on the respective semiconductor devices. After testing, the combined multi-chip semiconductor device is available for use and potential further packaging and processing.

In order to do the alignment, an alignment mechanism brings the mirror image surfaces of the two chips together (e.g., x,y,z stage with light pressure and a little searching near the correct alignment until the surfaces "snap" together into each other's ridges and valleys). Then, the surfaces are held together. For example, an adhesive could be applied between the surfaces or around the edge of the chips. Alternatively, a clamping mechanism could clip and maintain pressure perpendicular to the surfaces so as to hold the ridges in the valleys.

Although the above description has considered a five-layer metal process, it applies for any planar fabrication process where surface height is influenced by the layout of the layers beneath the surface. As an example of a non-chip application, in a multi-chip module (MCM) substrate created solely to form interconnect between chips, if the surface has height variations based on layout layers in the MCM's internal layers, then the MCM could be designed to mate with a chip or another MCM using the technique described in this specification. Additionally for integrated chips, the number of layers of metal increases with each new process generation, but the top layer(s) will typically still be non-planarized (to save on fabrication cost) so that this technique will continue to be available for future processes.

The surface height variations is not required to be tightly controlled by the fabrication process. However, the alignment technique described should be fairly insensitive to the specific height of the ridges or valleys. For the herringbone pattern, it may be desired that the ridges completely fit in the valleys, causing the aligned Metal5 pad pairs to contact. But complete fitting is easily available because the ridges are typically much shorter than the valley's depth. For the checkerboard pattern, the surface height variations would affect the distance between Melal5 pads, varying the capacitance. Circuits would need to be designed to handle a suitable range of possible capacitances based on expected height variations.

A particularly useful feature of the illustrated embodiments is utilization of existing fabrication processes without requiring any additional processing steps to add additional alignment or bonding mechanisms. This feature reduces cost and complexity. However, it is also possible that a fabrication process could be modified in order to enhance the surface irregularities. For instance, the oxide layer above the Metal5 region in the example devices could be thickened to be 2.0 um. A more pronounced surface topography could increase assembly speed, reliability, and retention, and offset any extra cost in fabrication.

Accordingly, the above disclosed subject matter is to be considered illustrative and the appended claims are intended to cover all such modifications and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A multi-chip semiconductor device comprising:
   a first semiconductor device having a first surface, the first surface including a first ridge alignment member and a second ridge alignment member, the first and second ridge alignment members forming a receiving area between the first and second ridge alignment members; and
   a second semiconductor device having a second surface, the second surface including a third ridge alignment member, the second semiconductor device positioned such that at least a portion of the third ridge alignment member is located within the receiving area of the first semiconductor device, wherein a first plurality of circuit pads on the first surface are substantially aligned with a second plurality of circuit pads on the second surface, such that a center point of each of the first plurality of circuit pads is located within three microns, in a lateral direction, the lateral direction parallel to a plane through one of the first surface and the second surface, of a corresponding center point of each of the second plurality of circuit pads, and wherein the first plurality of circuit pads are capacitively coupled to the second plurality of circuit pads.

2. The multi-chip semiconductor device of claim 1, wherein the second semiconductor device includes a fourth ridge alignment member and the third and fourth ridge alignment members form a second receiving area.

3. The multi-chip semiconductor device of claim 2, wherein at least a portion of the first ridge alignment member of the first semiconductor device is located within the second receiving area of the second semiconductor device.

4. The multi-chip semiconductor device of claim 1, wherein the first surface contains a plurality of ridge alignment members forming a first alignment pattern and wherein the second surface contains a plurality of ridge alignment members forming a second alignment pattern.

5. The multi-chip semiconductor device of claim 4, wherein the first alignment pattern is complementary to the second alignment pattern.

6. The multi-chip semiconductor device of claim 4, wherein the first alignment pattern is a substantially minor image of the second alignment pattern.

7. The multi-chip semiconductor device of claim 4, wherein the first alignment pattern is a checkerboard pattern.

8. The multi-chip semiconductor device of claim 4, where the first alignment pattern is a herringbone pattern.

9. The multi-chip semiconductor device of claim 1, wherein the first alignment ridge includes a metal portion and an oxide portion.

10. The multi-chip semiconductor device of claim 1, wherein the first surface comprises a first plurality of input/output pads and the second surface comprises a second plurality of input/output pads, the first plurality of input/output pads substantially aligned with the second plurality of input/output pads.

11. The multi-chip semiconductor device of claim 10, wherein the first plurality of input/output pads is capacitively coupled to the second plurality of input/output pads.

12. A multi-chip semiconductor device comprising:
    a first semiconductor device having a first surface, the first surface including a first alignment region on a portion of the first surface, the first alignment region including a first ridge alignment member and a second ridge alignment member, the first and second ridge alignment members forming a receiving area between the first and second ridge alignment members; and
    a second semiconductor device having a second surface, the second surface including a second alignment region on a portion of the second surface, the second alignment region including a third ridge alignment member, the second semiconductor device positioned such that the second alignment region opposes the first alignment region and such that at least a portion of the third ridge alignment member is located within the receiving area of the first semiconductor device, wherein the first plurality of alignment regions comprise a first set of four alignment regions, each of the four alignment regions disposed on one of four corner areas on the first surface, and wherein the second plurality of alignment regions comprise a second set of four alignment regions, each of the four alignment regions in the second set disposed on one of four corner areas on the second surface.

13. A semiconductor device comprising:
    an integrated circuit device having a first surface supporting a plurality of pad elements and a plurality of circuit elements, the first surface including a first ridge alignment member and a second ridge alignment member, the first and second ridge alignment members forming a receiving area between the first and second ridge alignment members, the receiving area formed to receive a third alignment member of a second integrated circuit device when the second integrated circuit device opposes and is substantially aligned with the integrated circuit device, such that a center point of each of the pad elements is located within three microns of a corresponding center point of a circuit pad element in the second integrated circuit device.

14. The semiconductor device of claim 13,
    further in combination with the second integrated circuit device.

15. A semiconductor device comprising:
    a first integrated circuit device having a first surface supporting a plurality of pad elements and a plurality of circuit elements, the first surface including a first alignment feature, the first alignment feature formed to mate with a second alignment feature of a second integrated circuit device when the second integrated circuit device opposes and as substantially aligned with the first integrated circuit device, such that a center point of each of the pad elements is located within three microns of a corresponding center point of a circuit pad element in the second integrated circuit device.

16. The semiconductor device of claim 15,
    further in combination with the second integrated circuit device.

17. The semiconductor device of claim 15,
    wherein the first surface further supports a second plurality of pad elements; and
    wherein the first alignment feature is formed to further mate with a third alignment feature of a third integrated circuit device when the third integrated circuit device opposes and is substantially aligned with the first integrated circuit device, such that a center point of each of the second plurality of pad elements is located within three microns of a corresponding center point of a circuit pad element in the third integrated circuit device.

18. The semiconductor device of claim 17, wherein the first integrated circuit device corresponds to a bridge device.

* * * * *

UNITED STATES PATENT AND TRADEMARK OFFICE
CERTIFICATE OF CORRECTION

PATENT NO. : 6,768,195 B2
DATED : July 27, 2004
INVENTOR(S) : Robert J. Drost

It is certified that error appears in the above-identified patent and that said Letters Patent is hereby corrected as shown below:

Column 7,
Line 3, "device baying a" should read -- device having a --.
Line 41, "substantially minor" should read -- substantially mirror --.

Column 8,
Line 44, "and as substantially" should read -- and is substantially --.

Signed and Sealed this

Eighteenth Day of January, 2005

JON W. DUDAS
*Director of the United States Patent and Trademark Office*